(12) United States Patent
Elnozahy

(10) Patent No.: US 6,317,867 B1
(45) Date of Patent: Nov. 13, 2001

(54) METHOD AND SYSTEM FOR CLUSTERING INSTRUCTIONS WITHIN EXECUTABLE CODE FOR COMPRESSION

(75) Inventor: Elmootazbellah Elnozahy, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/239,261

(22) Filed: Jan. 29, 1999

(51) Int. Cl.$^7$ .................................................. G06F 9/45
(52) U.S. Cl. .................................................................. 717/1
(58) Field of Search ........................... 717/1, 11; 382/232

(56) References Cited

U.S. PATENT DOCUMENTS

| | | | |
|---|---|---|---|
| 5,729,228 | * 3/1998 | Franaszek et al. | 341/106 |
| 5,764,994 | * 6/1998 | Craft | 395/709 |
| 6,125,201 | * 9/2000 | Zador | 382/166 |

OTHER PUBLICATIONS

Lekatsas et al. Code Compression for Embedded Systems. ACM. pp. 516–521, Jun. 1998.*
Breternitz Jr et al. Enhanced Compression Techniques to Simplify Program Decompression and Execution. IEEE. pp. 170–176, Apr. 1997.*
Arnavut et al. Block Sorting and Compression. IEEE. pp. 181–190, Apr. 1997.*
Lefurgy et al. Improving Code Density Using Compression Techniques. IEEE. pp. 194–203, Jan. 1997.*
Tong L. Yu, "Data Compression for PC Software Distribution," Software–Practice and Experience, vol. 26(11), pp. 1181–1195, Nov. 1996.
Christopher Fraser et al., "Custom Instruction Sets for Code Compression," pp. 1–9, Oct. 19, 1995.
Michael Franz et al., "Slim Binaries," Department of Information and Computer Science, University of California at Irvine, pp. 1–16.
Jens Ernst, "Code Compression," University of Arizona, pp. 358–365.

* cited by examiner

Primary Examiner—Kakali Chaki
Assistant Examiner—Wei Zhen
(74) Attorney, Agent, or Firm—Casimer K. Salys; Bracewell & Patterson, L.L.P.

(57) ABSTRACT

In accordance with a method and system of the present invention, a compression scheme for program executables is disclosed. First, instruction clustering starts by placing each instruction in a cluster by itself. The method and system then compute in an iterative fashion the distance between clusters, and merge the nearest clusters to form larger clusters. Therefore, instructions are clustered into groups, such that instructions belonging to the same cluster show similar bit patterns. This process stops when the number of clusters reaches a pre-specified goal. This goal is defined empirically, and may be adjusted if better compression can result. After all clusters have been defined, a suitable compressor is applied to each cluster to produce the compressed executable.

17 Claims, 2 Drawing Sheets

METHOD AND SYSTEM FOR CLUSTERING INSTRUCTIONS WITHIN EXECUTABLE CODE FOR COMPRESSION

RELATED CO-PENDING APPLICATION

This application relates to co-pending applications, entitled "METHOD AND SYSTEM FOR COMPRESSING REDUCED INSTRUCTION SET COMPUTER (RISC) EXECUTABLE CODE THROUGH INSTRUCTION SET EXPANSION", now U.S. Pat. No. 6,195,743 "METHOD AND SYSTEM FOR COMPRESSING REDUCED INSTRUCTION SET COMPUTER (RISC) EXECUTABLE CODE", application Ser. No. 09/239,259 and "METHOD AND SYSTEM FOR SCOPE-BASED COMPRESSION OF REGISTER AND LITERAL ENCODING IN A REDUCED INSTRUCTION SET COMPUTER (RISC)", now U.S. Pat. No. 6,233,674, all filed of even date herewith and assigned to the assignee herein named, the subject matter of each of which is incorporated herein by reference.

BACKGROUND OF THE INVENTION

1. Technical Field

The present invention relates to a method and system for compressing data in general. More particularly, the present invention relates to a method and system for compressing an executable program.

2. Description of the Prior Art

As software systems become more complex, the executable code of the programs implementing these systems have grown large in size. The large code size reduces instruction cache effectiveness and utilization of memory resources. It also increases program-loading time when code is shipped over in a network environment or retrieved from a slow mechanical device like a disk.

Currently, network computers, embedded controllers, set-top boxes, hand-held devices and the like receive executables over a network or possibly through slow phone links or communication channels. These devices may have very limited memory capacity and when their memory is constrained, large programs may not fit in the available memory to run on the device. Highly efficient code compression mitigates the disadvantage of large executable sizes. However, compressing executable programs has traditionally been difficult.

The fundamental reason of why compressing executable code is difficult is the lack of common patterns that a traditional compressor can discern easily. In prior art, compression schemes use some form of spatial or temporal proximity when analyzing the input stream. Alternatively, a traditional compressor may use some form of a histogram to gather information about the various patterns that occur within an input stream. In either case, similar instructions that follow a common pattern may not necessary occur close to one another. Furthermore, forming a histogram may not be straightforward if instructions do not follow uniform formats, such as in Complex Instruction Set Architecture (CISC) or an elaborate Reduced Instruction Set Architecture like the PowerPC, which contains over 30 different instruction formats.

Disclosed herein is a better approach than the traditional schemes, where instructions are clustered within a program according to common patterns. The instructions within each cluster are then compressed independently by an appropriate compressor. Operating on a cluster instead of the entire instruction stream, a traditional compressor is effective in producing compact code due to the ease of discerning patterns among structurally similar instructions, and the limited number of patterns within each cluster. It is also desirable to use different compressors for different clusters. Therefore there is a need to maximize the compression of an overall program by grouping instructions within the program into clusters, then compressing each cluster using the compression scheme that would yield the best results for that particular cluster. The present invention solves these problems by presenting a technique in a novel and unique manner, which is not previously known in the art.

SUMMARY OF THE INVENTION

In view of the foregoing, it is therefore an object of the present invention to provide an improved method and system for compressing executable programs.

It is another object of the present invention to provide an improved method and system for compressing executable programs by clustering instructions such that instructions within each cluster show similar patterns.

It is yet another object of the present invention to provide an improved method and system for compressing the clusters of instructions using different compressors, such that each cluster is compressed independently by an appropriate compressor to produce highly compressed code.

In accordance with a method and system of the present invention, a compression scheme for program executables is disclosed. First, instruction clustering starts by placing each instruction in a cluster by itself. The method and system then compute in an iterative manner the distance between clusters, and merge the nearest clusters to form larger clusters. Therefore, instructions are clustered into groups, such that instructions belonging to the same cluster show similar bit patterns. This process stops when the number of clusters reaches a pre-specified goal. This goal is defined empirically, and may be adjusted if better compression can result. After all clusters have been defined, a suitable compressor is applied to each cluster to produce the compressed executable.

All objects, features, and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF A PREFERRED EMBODIMENT

Figure 1:
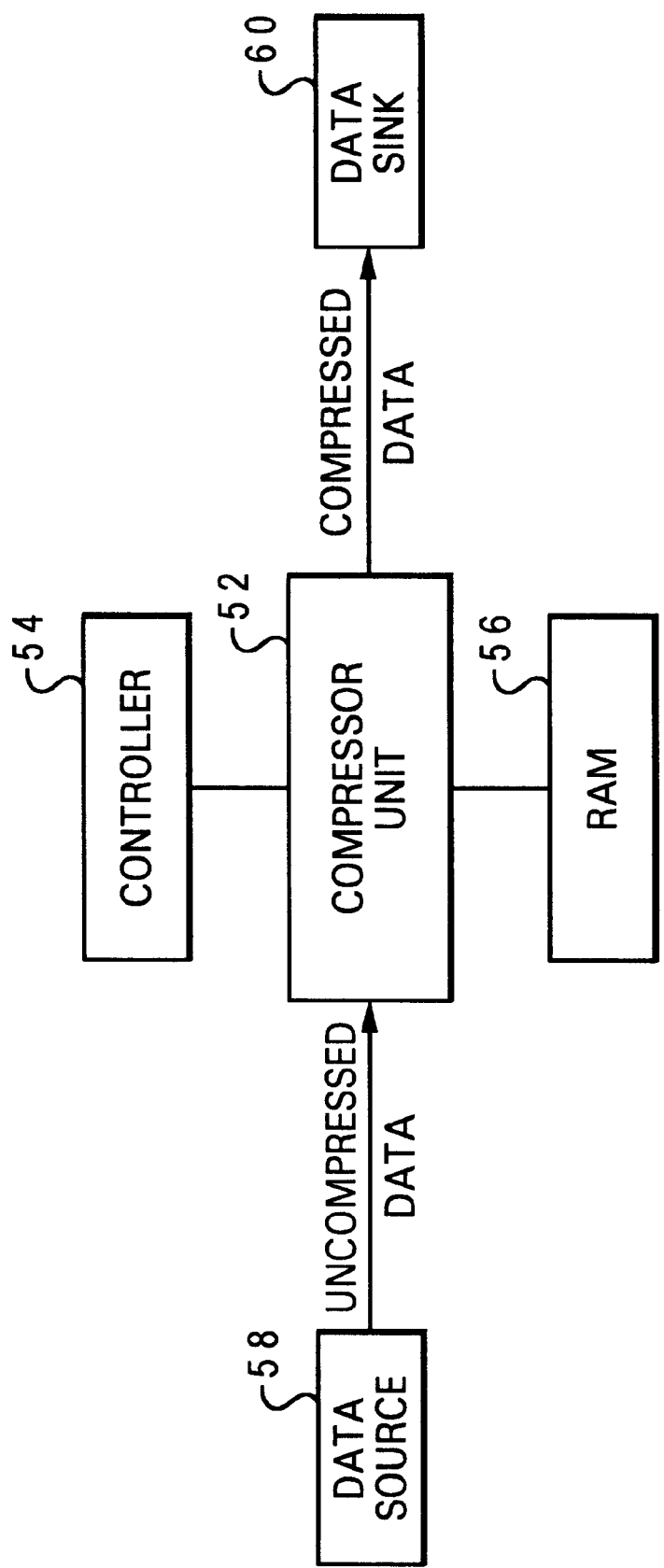
FIG. 1 is a block diagram of a compressor unit in which a preferred embodiment of the present invention may be incorporated.

Those skilled in the art may appreciate that the disclosed invention herein may be implemented in hardware or in software. With reference now to the figures and in particular with reference to FIG. 1, there is depicted a block diagram of a data compressor unit in which a preferred embodiment of the present invention may be incorporated. As shown, compressor unit 52 is coupled to a controller 54 and a random-access memory (RAM) 56. The controller 54 contains the permanent logic of the compressor in the form of non-volatile memory. During operation, compressor unit 52 receives from a data source 58 an uncompressed stream representing the executable. After clustering the instructions within the program as described herein, the compressor applies different compression techniques on various clusters and produces the compressed data stream to a data sink 60. The data sink 60 could be a storage device or a communication link.

The main idea of the disclosed technique follows. When compressing executable code of a computer program, a compressor would not achieve the best results because the sequence of instructions according to the order in which they appear in a program may not easily reveal common patterns that could be exploited in compression. The technique disclosed herein clusters instructions into groups, such that instructions belonging to the same cluster show common patterns. In accordance with the preferred embodiment of the present invention, the clustering starts by placing each instruction in a cluster by itself. The method then computes in an iterative fashion the distance between clusters, and merges the nearest clusters to form larger clusters. The method stops when the number of clusters reaches a pre-specified goal. This goal is defined empirically, and it could be adjusted if better compression can result. After all clusters have been defined, a suitable compressor is applied to each cluster to produce the compressed executable.

Figure 2:
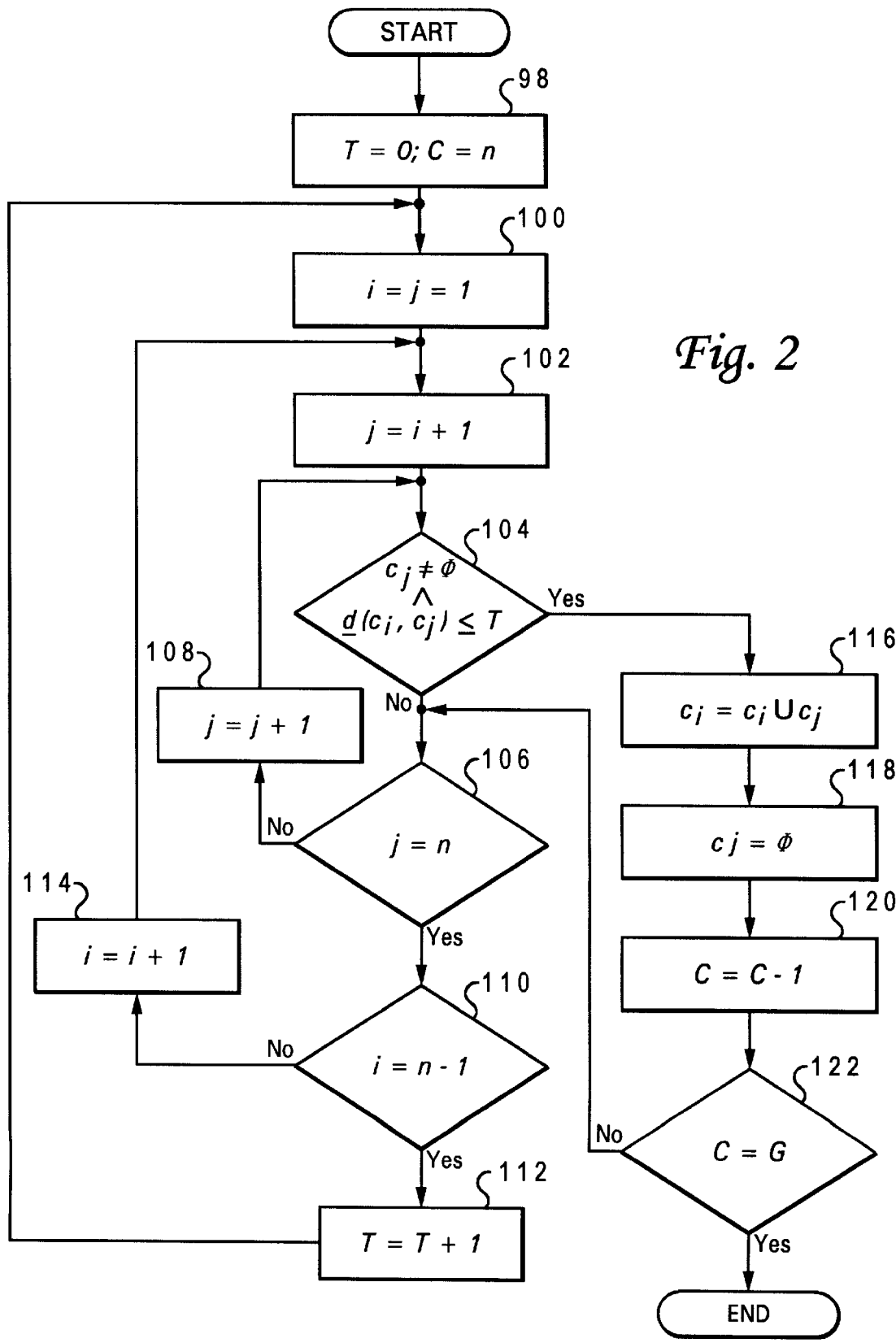
FIG. 2 is a high-level flowchart illustrating the steps for clustering instructions within a program executable.

Referring now to FIG. 2, there is illustrated a high-level flowchart for implementing the clustering technique in accordance with the present invention. Before following the flowchart however, we must first define the majority bit m of n bits to be 0 if t bits out of n are 0, 1 if t bits out of n are 1, or x (don't care) otherwise, where $t>n/2$. We call t the majority threshold. Next, the modulus $|a|$ of a 32-bit quantity "a" as the number of bits equal 1 in "a". The average of a group of n 32-bit instructions is defined as the 32-bit quantity $a_0, a_1, \ldots, a_{31}$ where:

$a_i=m(b_{ij})$, where $b_{ij}$ is the $i^{th}$ bit of the $j^{th}$ instruction, $j \leq n$.

The distance d between any two 32-bit instructions i and j is defined as:

$d(i,j)=|i \oplus j|$ where $\oplus$ is the bitwise XOR of the two instructions. The distance d between an instruction i and the average j of a set of n instructions is computed in the same manner as the distance between two instructions, except that when a don't care bit is XOR'ed with 1 or 0, it produces 1. Similarly, define the distance d between the averages of two sets of instructions in the same manner.

Referring to FIG. 2, the technique for clustering starts at step 98 with the variable T set equal to zero, and C the number of clusters set equal to n, the number of instructions, as shown in step 98. The variable T represents the threshold for deciding when to merge two clusters. The process proceeds to step 100, with variables i and j set equal to one. These variables are used for iterating over the available clusters and computing the distances between them as defined above. The process continues to step 102 with j equal to i +1. At this point in the process the distance d between any two clusters ci and cj is examined in step 104 to see if it is less than T. If it is, the process proceeds to step 116 and the clusters are merged and cj is set to empty in step 118. C is then equal to C minus 1 and checked to see if it matches with G, shown in steps 120 and 122. When C equals G than the process ends at step 124 as described above. G is the desired number of clusters.

If the test in step 104 fails, then processing proceeds to step 106 which together with steps 108, 110 and 114 implement two nested loops that enable the process to compute the distances among every two conceivable clusters. After all such possible combinations have been examined, it is clear that the threshold for combining clusters is too tight. Therefore, it is relaxed by incrementing the variable T in step 112. This process continues, until the desired cluster level is reached in step 122.

After all clusters have been formed, the compressor applies traditional compression schemes on the various clusters and produces the best combination of results.

It is also important to note that although the present invention has been described in the context of a hardware compressor, those skilled in the art will appreciate that the mechanisms of the present invention can be implemented in software and be distributed as a program product in a variety of forms, and that the present invention applies equally regardless of the particular type of signal bearing media utilized to actually carry out the distribution. Examples of signal bearing media include but are not limited to recordable type media such as floppy disks or CD ROMs, and transmission type media such as analog or digital communications links.

While the invention has been particularly shown and described with reference to a preferred embodiment, it will be understood by those skilled in the art that various changes in form and detail may be made therein without departing from the spirit and scope of the invention.

What is claimed is:

1. A method for code compression for executable code, said method comprising the steps of:

placing each instruction in executable code in a cluster;

computing in iterative fashion distance between clusters;

merging nearest clusters to form larger clusters;

applying a suitable compressor to each said cluster to produce new compressed executable code.

2. The method for code compression for executable code according to claim 1, wherein merging nearest clusters to form larger clusters further comprises the step of:

stopping when a number of clusters reaches a pre-specified goal wherein said goal is defined empirically.

3. The method for code compression for executable code according to claim 2, wherein said goal is defined empirically further comprises the step of:

adjusting said goal if better compression can result.

4. The method for code compression for executable code according to claim 1, wherein applying a suitable compressor further comprises the step of:

using different compressors for different clusters.

5. The method for code compression for executable code according to claim 1, further comprises the step of:

forming clusters having said instructions forming a bit stream.

6. The method for code compression for executable code according to claim 1, wherein expanding said RISC instruction set further comprises the step of:

clustering said instructions such that said clusters contain said instructions that exhibit similar patterns.

7. An information handling system, comprising:

means for placing each instruction in executable code in a cluster;

means for computing in iterative fashion distance between clusters;

means for merging nearest clusters to form larger clusters;

means for applying a suitable compressor to each said cluster to produce new compressed executable code.

8. The information handling system according to claim 7, comprising:

means for stopping when a number of clusters reaches a pre-specified goal wherein said goal is defined empirically.

9. The information handling system according to claim 8, comprising:

means for adjusting said goal if better compression can result.

10. The information handling system according to claim 7, comprising:

means for using different compressors for different clusters.

11. The information handling system according to claim 7, comprising:

means for forming clusters having said instructions forming a bit stream.

12. The information handling system according to claim 7, comprising:

means for clustering said instructions such that said clusters contain said instructions that exhibit similar patterns.

13. A computer program product residing on a computer usable medium for code compression, comprising:

instruction means for placing each instruction in executable code in a cluster;

instruction means for computing in iterative fashion distance between clusters;

instruction means for merging nearest clusters to form larger clusters;

instruction means for applying a suitable compressor to each said cluster to produce new compressed executable code.

14. The computer program product according to claim 13, comprising:

instruction means for stopping when a number of clusters reaches a pre-specified goal wherein said goal is defined empirically.

15. The computer program product according to claim 13, comprising::

instruction means for adjusting said goal if better compression can result.

16. The computer program product according to claim 13, comprising:

instruction means for using different compressors for different clusters.

17. The computer program product according to claim 13, comprising:

instruction means for forming clusters having said instructions forming a bit stream.

* * * * *